United States Patent [19]

Bozeman, Jr.

[11] Patent Number: 5,359,896
[45] Date of Patent: Nov. 1, 1994

[54] ACCELERATION RECORDER AND PLAYBACK MODULE

[75] Inventor: Richard J. Bozeman, Jr., Dickinson, Tex.

[73] Assignee: The United States of America as represented by the Administrator of the National Aeronautics and Space Administration, Washington, D.C.

[21] Appl. No.: 940,420

[22] Filed: Sep. 3, 1992

[51] Int. Cl.$^5$ ............................................. G06F 15/74
[52] U.S. Cl. ........................................ 73/590; 73/593
[58] Field of Search ................ 73/1 R, 1 D, 590, 593; 364/550, 508; 365/45–48; 360/6

[56] References Cited

U.S. PATENT DOCUMENTS

| | | | |
|---|---|---|---|
| 3,016,457 | 1/1962 | Brown et al. | 73/593 |
| 4,313,178 | 1/1982 | Stern et al. | 365/183 |
| 4,332,015 | 5/1982 | Rimdzius | 365/45 |
| 4,400,783 | 8/1983 | Locke, Jr. et al. | 364/550 |
| 4,453,407 | 6/1984 | Sato et al. | 73/462 |
| 4,519,398 | 5/1985 | Lisiecki et al. | 128/710 |
| 4,608,650 | 8/1986 | Kapadia | 364/508 |
| 4,627,027 | 12/1986 | Rai et al. | 365/45 |
| 4,701,866 | 10/1987 | Harrison et al. | 364/550 |
| 4,811,285 | 3/1989 | Walker et al. | 365/45 |
| 4,977,516 | 12/1990 | Shepherd | 364/508 |
| 4,989,179 | 1/1991 | Simko | 365/45 |
| 5,063,527 | 11/1991 | Price et al. | 364/550 |
| 5,065,321 | 11/1991 | Bezos et al. | 360/6 |
| 5,150,313 | 9/1992 | van den Engh et al. | 364/550 |

*Primary Examiner*—Robert Raevis
*Attorney, Agent, or Firm*—Hardie R. Barr; Guy M. Miller; Edward K. Fein

[57] ABSTRACT

The present invention is directed to methods and apparatus relating to an accelerometer electrical signal recorder and playback module. The recorder module may be manufactured in lightweight configuration and includes analog memory components to store data. Signal conditioning circuitry is incorporated into the module so that signals may be connected directly from the accelerometer to the recorder module. A battery pack may be included for powering both the module and the accelerometer. Timing circuitry is included to control the time duration within which data is recorded or played back so as to avoid overloading the analog memory components. Multiple accelerometer signal recordings may be taken simultaneously without analog to digital circuits, multiplexing circuitry or software to compensate for the effects of multiplexing the signals.

10 Claims, 2 Drawing Sheets

ACCELERATION RECORDER AND PLAYBACK MODULE

ORIGIN OF THE INVENTION

The invention described herein was made by an employee of the United States Government and may be manufactured and used by or for the Government of the United States of America for governmental purposes without the payment of any royalties thereon or therefor.

TECHNICAL FIELD

The present invention relates to apparatus and method for recording machine vibration. More specifically, the present invention is directed to a solid state analog acceleration recorder and playback module having significant advantages over conventional recorders.

BACKGROUND ART

Vibration analysis has been used for years to provide a determination of the proper functioning of different types of machinery, including rotating machinery and rocket engines. A determination of a malfunction, if detected at a relatively early stage in its development, will allow changes in operating mode or a sequenced shut down of the machinery prior to a total failure. Such preventative measures result in less extensive and/or less expensive repairs, and can also prevent a sometimes catastrophic failure of equipment.

One approach to monitoring the health of machinery involves scheduled recording and playback of vibration data over time to provide historical mapping of the machine using frequency and power spectral density analysis. By this process, degradation of machine internal components can be identified. Currently, to record machine vibration data, the output from an accelerometer is conveniently first connected to a signal conditioning module. The conditioned accelerometer signal is then recorded either on digital magnetic tape, analog magnetic tape, or a digital computer system with large random access memory. Alternatively, a spectrum analyzer may be periodically transported to the machine under observation for direct measurements.

The current method for obtaining machine vibration information thus requires the use of bulky and expensive instrumentation. It is difficult to transport such sophisticated equipment without increasing the already substantial cost of maintenance of such equipment. There is also a significant amount of lost labor time incurred due to the difficulties of transporting relatively fragile and bulky instrumentation.

U.S. Pat. No. 4,977,516 to J. E. Shepherd discloses a data acquisition device which has the capability to receive input simultaneously from a plurality of vibration sensors using a microprocessor which stores and processes the data collected. One problem with such data acquisition devices is the need to digitize data prior to storing it. Digitized data requires a large amount of memory for storage and requires additional circuitry. Also problems exist where multiple analog inputs are needed because they are typically multiplexed prior or subsequent to digitizing. Since the machine is rotating, compensation must be made for the fact that measurement signals may not actually be taken simultaneously, and are generally taken at different points during the shaft rotation due to the multiplexing. Such a system requires additional software/hardware to compensate for the time delay which otherwise may result in the loss of desired information. As an example of such compensation, U.S. Pat. No. 4,608,650 to N. S. Kapadia uses non-recursive tracking digital filtering to determine a peak velocity or displacement of the rotating engine for processing sampled accelerometer data. In a different operating phase, the Kapadia apparatus determines the rotational location of the peak relative to an index or reference point on the rotating engine.

U.S. Pat. No. 4,453,407 to Sato et al. discloses a sophisticated system which may be difficult and bulky to transport for on-site vibration analysis.

U.S. Pat. Nos. 4,313,178 to Stern et al., 4,989,179 to R. T. Simko, and 4,627,027 to Rai et al., disclose solid state analog memory elements but do not disclose circuitry for recording of accelerometer information. Although R. T. Simko suggests that his analog memory storage element may be used to record vibration, he does not disclose how this should be accomplished.

The presently available accelerator recording and analysis systems provide valuable information, but they are bulky and expensive. Consequently, a need exists for improvements in accelerometer recording devices to decrease their high cost, as well as their complexity and difficulties of transportation logistics. Those skilled in the art have long sought and will appreciate the novel features of the present invention which solves these problems.

STATEMENT OF THE INVENTION

The present invention is directed to a solid state analog acceleration recorder and playback module that is relatively light weight and low in cost. In one preferred embodiment, the recorder is battery powered. In this embodiment, the battery may conveniently be used to supply power to the accelerometer(s). Conditioning circuitry is included within the module to condition the accelerometer signal prior to storage. This conditioning circuitry may include voltage dividers, amplifiers, and filters of various types. In a preferred embodiment, adjustable components are available in the conditioning circuitry to change degrees of signal filtering as required. The memory for the recorder is comprised of a solid state analog storage chip. This chip may be removable to thereby allow the recorder module to be built into other monitoring equipment with only the storage chip itself being removed for playback at another time and place.

With the present invention, there is no need for digitizing equipment since the analog storage chip stores analog signals directly into its memory cells rather than digitizing the signals prior to storing. Digitized signals require more memory cells per each digitized sample than analog signals. For instance, an eight bit sample will require eight memory cells per sample as compared to an analog memory circuit which requires only one memory cell per sample.

Multiple inputs can be accommodated with this device by adding additional memory chips and conditioning circuits without the need for multiplexing circuitry and software. This feature makes recording of simultaneous multiple analog signals no more complex and difficult than recording a single analog signal since no additional circuitry and software is needed for functions such as multiplexing, compensation for phase shifts caused by the multiplexing, etc. Additional analog memory chips may be configured in sequence to increase the time duration over which signals can be stored. A preferred embodiment analog memory chip includes digital addressing which allows for segmenting a recording duration. For example, a 16 second duration of recording may be broken into four 4 second segments.

A timing circuit is used for control of the analog memory chip(s). When activated, the timing circuit in turn activates the memory chip to begin recording or playing back. Manual switching may be used to activate the recording module and/or an automatic controller may be used. Data may be recorded at preselected times and/or at the occurrence of specific data level trip points. The timing circuit includes an adjustment to set the duration of the timing or playback operation to avoid overloading the analog memory storage chip. A timing circuit and/or the end of data control lines on individual analog memory chips may be used to provide a continuous loop playback.

BRIEF DESCRIPTION OF THE DRAWINGS

Other features and intended advantages of the present invention will be readily apparent by the references to the following detailed description in connection with the accompanying drawings, wherein.

While the invention will be described in connection with the presently preferred embodiment, it will be understood that it is not intended to limit the invention to this embodiment. On the contrary, it is intended to cover all alternatives, modifications, and equivalents as may be included in the spirit of the invention.

DETAILED DESCRIPTION OF THE INVENTION

The present invention is directed to a solid state analog acceleration recorder and playback module which, in a preferred embodiment is battery powered and easily transportable for on site recording of accelerometer data.

Figure 1:
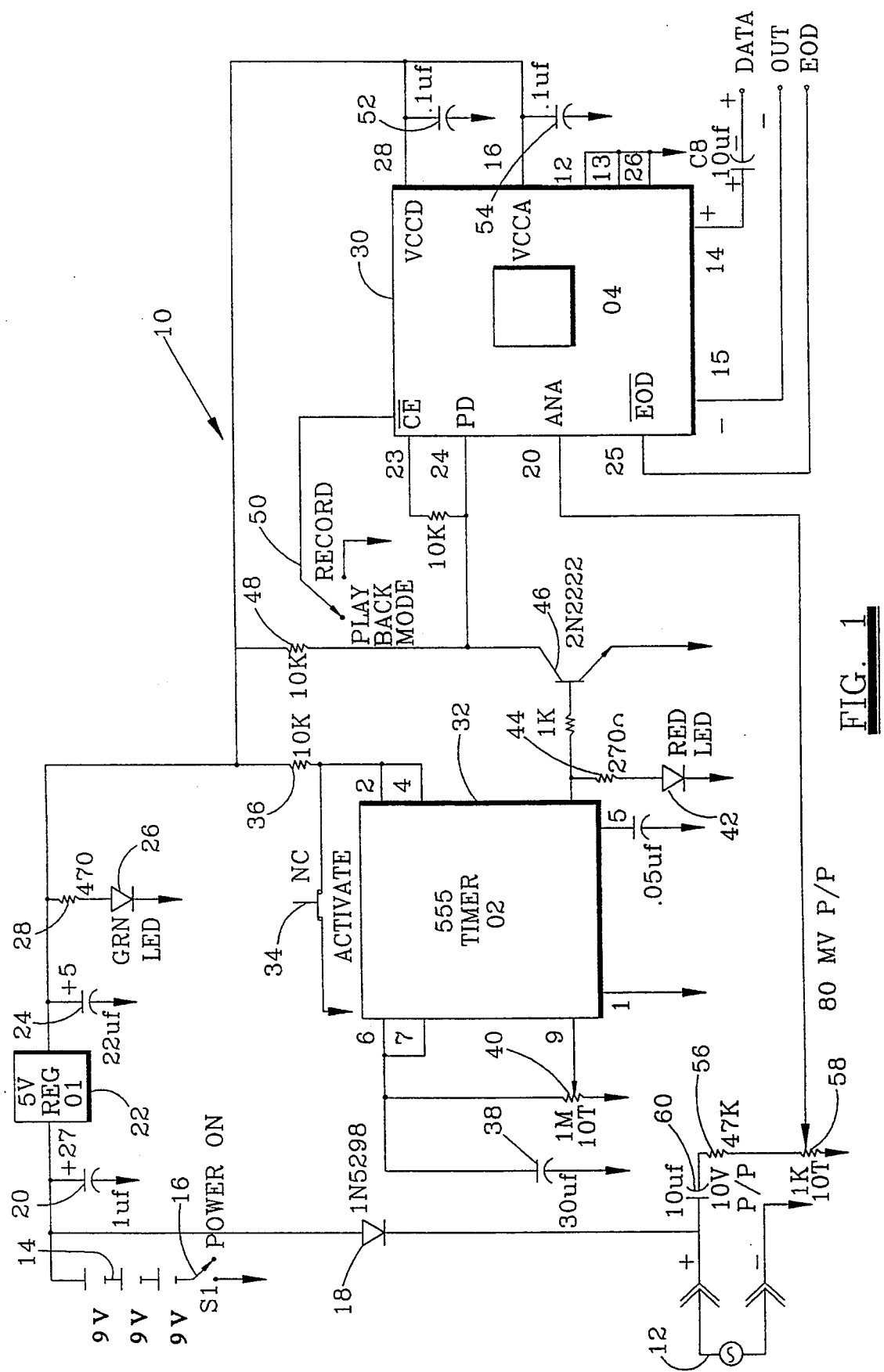
FIG. 1 is a diagrammatic representation of an accelerometer recorder and playback module in accord with the present invention.

FIG. 1 discloses, in diagrammatic form, acceleration recorder module 10 in accord with the present invention. Although specific values or specific types of components are disclosed as preferred embodiment electronic components in FIG. 1, it is understood that other values/types of components may be used in many instances. It is also understood that while specific circuitry is disclosed, other circuitry may be substituted to produce a similar effect or for a similar function. Accelerometer 12 is shown connected to recorder module 10 and may include various associated circuitry, including amplifiers which may be used to increase the accelerometer output. Power for accelerometer 12 and any circuitry associated with accelerometer 12 is supplied by battery pack 14. In the present embodiment, battery pack 14 includes three nine volt transistor batteries. Additional batteries may be used as necessary to power supplementary circuitry which may include additional features or enhancements of recorder module 10 as described hereinafter. Batteries other than nine volt transistor batteries may be used although the use these batteries provide for a lightweight, easily transportable, recorder module 10. Switch 16 may be used to turn off and on circuit power from battery pack 14. Switch 16 may be either a manual switch or electronic switch or relay depending on the application of recorder module 10. In this embodiment, 27 volts are applied to accelerometer 12 through current regulator diode 18 which regulates direct current to approximately two to four milliamperes in amplitude. Current regulator diode 18 as shown is a 1N5298 type diode. Capacitor 20, a 1 microfarad capacitor, is used to filter the 27 volt output of battery pack 14 prior to application to 5 volt regulator 22. A regulated 5 volt output from 5 volt regulator 22 is further filtered by capacitor 24 which is shown as a 22 microfarad capacitor. Circuit power also activates a green "power on" indicator in the form of light emitting diode 26. Resistor 28, shown as 470 ohms, limits current through LED 26. Regulated 5 volts is used to supply power to recorder module 10 circuitry which includes analog storage memory component 30, shown as an ISD 1016 integrated circuit, and timer component 32, shown as a 555 timer integrated circuit.

Timer component 32, as well as other associated timing circuitry, is used to control the period of operation of memory component 32 during which analog signals from accelerometer 12 are either stored or played back. Switch 34 is used to initiate operation of timer component 32. Switch 34 may be either a manual switch and/or some type of electronic switch which may allow for automatic recording such as might occur if a trip point is activated in circuitry associated with accelerometer 12. Switch 34, which is normally open, may be closed to produce zero volts or a "logic low" condition at pins 2 and 4 of timer component 32. Resistor 36, shown with a value of 10 kilo-ohms, limits current which flows through switch 34. A logic low condition at pins 2 and 4 causes pin 3, shown connected to resistor 44, to go from a logic low condition to a logic high condition for a predetermined amount of time dependent upon the values of capacitor 38 and variable resistor 40. In a preferred embodiment, capacitor 38 has a value of 30 micro-farads and variable resistor 40 is a ten turn 1 mega-ohm potentiometer. Due to the fact that different analog storage memory components have different storage capacities, the time duration of the pulse, or pulse width, produced at pin 3 of timer component 32 should be adjusted to match the operation of analog memory component 30. A visual indication of recording or playback operation is provided by red light emitting diode (LED) 42 which is activated so long as a logic high condition occurs at pin 3. Resistor 44, shown with a value of 270 ohms, limits current through LED 42. A high logic condition at pin 3 of timer component 32 also turns on NPN transistor 46 to produce a logic low at the collector of transistor 46. This causes a logic low condition at the collector of transistor 46 and also a logic low condition at the chip enable (CE) and the power down (PD) pins of analog storage memory component 30. Resistor 48 limits current flow through transistor 46.

Although an ISD 1016 integrated circuit (i.c.) is disclosed for use as analog memory component 30, other analog memory integrated circuits (i.c.'s) may also be used depending on the desired duration of the analog signal to be recorded and the frequencies of the signal anticipated. The ISD 1016 i.c. has enough memory to record for a duration of 16 seconds with a bandpass of 3.4 Khz. An ISD 1020 may be used for a duration of 20 seconds and has a bandpass of 2.7 Khz. An ISD 1012 is also available to record for 12 seconds with a bandpass of 4.5 Khz. Other analog memory devices may also be used as available. Memory components may be also be cascaded to increase the available recording duration. Variable resistor 40 is used to set the period of operation of memory component 30 to be less than the total time during which memory component 30 can record or playback to avoid memory overflow. By using the ISD 1016 i.c. which has a total memory capacity to allow 16 seconds of data to be recorded, the time period is preferably set at 15 seconds by use of variable resistor 40. The record and playback time period are both determined by the setting of resistor 40 and are, therefore, of the same duration in a preferred embodiment of the present invention. If recording time periods are segmented, for instance, into four 4 second periods, it may, in some cases, be desirable to have an approximate 16 second playback to show trends or for other purposes. Digital counting circuitry and indicating means may also be used with segmented recording periods so as to indicate which segments are being used and to coordinate operation thereof. While address lines from pins 1-10 of memory component 30 are shown grounded, it is possible to use memory component as an addressable component if, for instance, the circuit is under micro-computer control.

Figure 2:
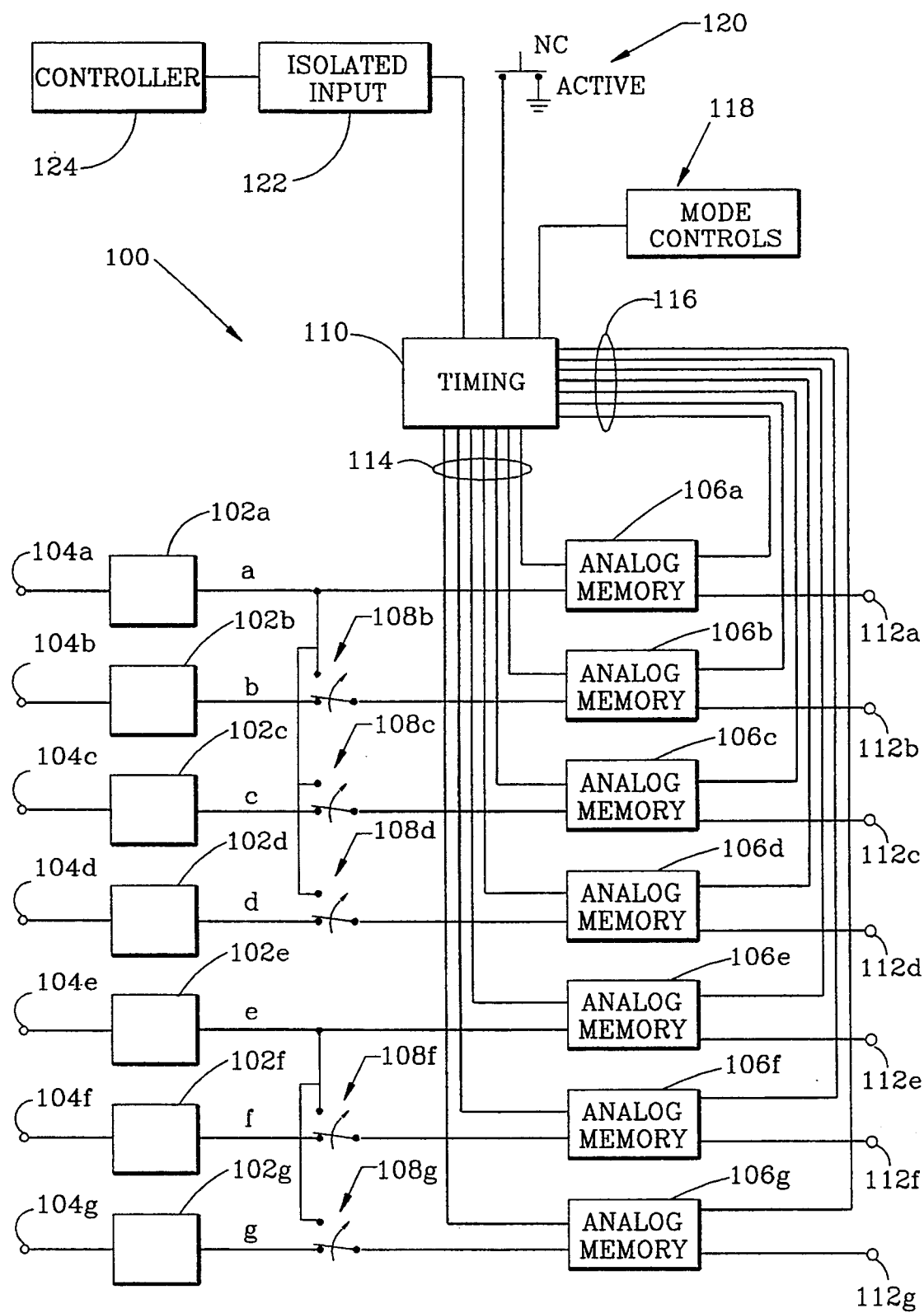
FIG. 2 is a block diagrammatic representation of a multiple channel accelerometer recorder and playback module in accord with the present invention.

Switch 50 determines whether analog memory component 30 is in a record mode or a playback mode and may be either a manual switch as shown or an electronic switch. Capacitors 52 and 54 are power filters and each have a value of 0.1 micro-farads in a preferred embodiment. When memory component 30 is in a playback mode as determined by switch 50 and timer component 32, then analog data is played back between terminal 14 of memory component 30 and ground. An end of data signal (EOD) which is available at the EOD terminal goes from logic high to logic low as an end of data mark for external devices such as a spectrum analyzer. The EOD data line may also be used to transfer data to additional cascaded chips to extend recording/playback time. Memory component 30 may be socket mounted so as to be removable from the circuit shown in FIG. 1 without the need for desoldering by applying heat at a temperature high enough to melt solder at the individual pins of memory component 30. The advantage of this feature is that only memory component 30 would have to be carried to a playback device located at a more convenient location. This feature could also be applied to a removable memory board for playback at a more convenient location and which might contain either a plurality of individual transducer signal recordings or perhaps a single more lengthy recording. Multiple analog memory component circuitry is shown in FIG. 2 which is discussed hereinafter.

Resistors 56 and 58 are used to attenuate an analog accelerometer signal from accelerometer circuit 12 and to establish, in a preferred embodiment, a 50 millivolt peak to peak analog signal at pin 20, the analog input terminal of memory component 30. Resistor 56 has a nominal value of 47 kilo-ohms and resistor 58 is a 1 kilo-ohm potentiometer used for scaling the analog accelerometer signal. Capacitor 60 is used to block direct current voltage from battery pack 14 entering the attenuation circuitry formed of resistor 56 and 58. Capacitor 61, nominally having a value of 1 micro-farad, blocks D.C. signal components including any offset bias that may be developed and allows only dynamic signal to reach analog signal input 20 of memory component 30. Additional filter conditioning circuitry besides capacitor 60 and resistors 56 and 58 may also be used as desired. Such conditioning circuitry may include bandpass filters, cycle counting circuitry, high pass filters, low pass filters, etc. and may be similar to circuitry shown in U.S. Pat. No. 4,977,355 to R. J. Bozeman which is incorporated herein by reference. Incorporation of filter conditioning circuitry within recorder module 10 reduces noise, interference, and ground loop error which may otherwise occur with separate conditioning circuitry and recording apparatus.

Without substantial change in weight, basic circuitry shown in recorder module 10 may be modified to provide additional sophistication as shown in recorder module 100. Most blocks shown in FIG. 2 have analogous counterparts shown in FIG. 1. Analog channels a-g in FIG. 2 include inputs with associated conditioning circuits and memory components that are analogous to those discussed in connection with FIG. 1. Signal conditioning circuits 102a-102g may be used to condition multiple analog signals which are applied to input terminals 104a-104g respectively. Each input terminal 104a-104g provides a separate signal channel so that simultaneous recording can be made without the need for analog to digital converters, multiplexing circuitry, compensation software, and so forth. If desired, one channel may be used to provide a shaft rotation input signal which will be available simultaneously with various accelerometer signals for synchronization purposes or shaft orientation purposes. Although seven input channels are shown in FIG. 2, the number of channels may be more or less as desired. Analog memory components 106a-106g are shown associated with inputs 104a-104g respectively. While one analog memory component is shown associated with each channel, it would be possible to have greater numbers of analog memory components associated with each channel to increase storage capacity per channel. Outputs 112a-g are available for external connection to vibration analysis equipment.

Switches 108 b-d, f, g. are indicated as associated with their respective channels. Many arrangements of these switches may be made as will be discussed. As illustrated, switches 108b,c,d may be used to allow for parallel or simultaneous operation of channels a-d or may optionally be used to connect several analog memory components to channel "a" so that data storage capacity may be selectively increased for at least one channel. Switches 108 b-d may be moved to the position opposite from that shown in FIG. 2 to connect their respective analog memory components 106 b-d to channel "a". With proper control signals from timing circuit 110, four times as much data may be stored with respect to channel "a" as would have been possible otherwise. Switches 108f,g allow three times as much data to be stored with respect to channel "e" as would have been possible without switching. Alternatively, switches 108b-d, f,g may be set for parallel operation of all channels. It will be appreciated that other possible operating modes are also conceivable using these same switches. On the other hand, it may be more desirable to use multiple pole switches connecting simultaneously to all or most channels and having only two possible switch positions to make operation more convenient. It is also possible that switches may be electronically controlled for operation as desired. Those skilled in the art will realize that other arrangements, numbers, and/or combinations of switches may be used.

Timing control 110 uses EOD (end of data) lines 114 for operation of analog memory components 106a–g although this is not mandatory since timing signals can be generated without the EOD signals. In practice, lines 114 may be connected directly to each subsequent analog memory component if it is desired to dedicate the circuit to cascade operation. Alternatively, timing control 110 may be used for selective connection of lines 114 as desired. Such selective operation may include a cascade mode or a parallel mode or some combination of the two with some channels having cascaded memory components as desired. As each analog memory component reaches capacity, an end of data flag is set and applied to the appropriate line 114 which prompts timing circuit 110 to initiate operation of a subsequent analog memory component via control lines 116. Control lines 116 may each comprise several connections to each analog memory component since several terminals are involved in controlling each analog memory component. At least one or more of EOD lines 114 may also be used as an output for use in synchronizing externally located vibration analysis machines (not shown). The circuit configuration of recorder 110 may be optimized with knowledge of specific operating specifications.

Mode control circuitry may include switches or other means to interface to a user for selection and indication of the desired operating mode. These controls may be rather sophisticated or elementary depending on the operating specifications desired. However, even with sophisticated operations, the overall weight of recorder module 100 will be quite low—typically less than 4 kilograms due in main to the light weight analog memory components and the combined signal conditioning components. It may be desirable to have a low power CMOS computer chip for use as a combination mode control 118 and timing 110 circuit.

Switch 120 may be used to initiate recording or playback after mode of operation is determined. Switch 120 may be an electronic switch operated by other control circuitry. As well, isolating circuitry 122 may be used to receive a control signal from machinery which is being observed by controller 124 to automatically initiate operation. Controller 124 will typically be physically attached to monitoring equipment (not shown) so that substantial electrical noise and/or ground loops may exist between controller 124 and isolated input 122. By using isolated input 122 containing isolating circuitry such as optical isolation means, noise and/or ground loop problems which may trigger false alarms can be greatly reduced.

The foregoing description of the invention has been directed in primary part to a particular, preferred embodiment in accordance with the requirements of the patent statutes and for purposes of illustration. It will be apparent, however, to those skilled in the art that many modifications and changes in the specifically described recorder module 10 or 100 may be made without departing from the scope and spirit of the invention. For instance, individual circuits shown and described may be combined into a single circuit or circuit element. Therefore, the invention is not restricted to the preferred embodiment illustrated but covers all modifications which may fall within the spirit of the invention.

I claim:

1. A method for recording and playback of an analog transducer signal, comprising the following steps:

conditioning said analog transducer signal by scaling said analog transducer signal to form a conditioned analog signal;

placing a solid state analog storage device into a record mode;

applying said conditioned analog signal to said solid state analog storage device;

producing a first timing pulse of a predetermined duration;

applying said first timing pulse to said solid state analog storage device to enable operation of said solid state analog storage device;

storing said conditioned analog signal; and sequentially enabling a plurality of solid state analog storage devices.

2. The method of claim 1, further comprising:

physically separating said solid state storage device from electrical connections to said conditioned analog signal for playback at another location.

3. The method of claim 1, wherein the step of applying a first timing pulse comprises:

actuating a timing circuit with a digital control signal.

4. The method of claim 3, further comprising the step of:

optically isolating said digital control signal.

5. The method of claim 1, further comprising the step of:

supplying electrical power to an analog transducer with a battery pack for production of said analog transducer signal.

6. The method of claim 1, further comprising the step of:

simultaneously conditioning a plurality of analog transducer signals to form a plurality of conditioned analog transducer signals; and applying said first timing pulse to a plurality of solid state analog storage devices for simultaneous recording respective ones of said plurality of conditioned analog transducer signals.

7. The method of claim 6, further comprising the step of:

storing signals applied to said plurality of solid state analog storage devices during said first timing pulse.

8. The method of claim 7, further comprising:

applying analog signals from said plurality of solid state analog storage devices to a plurality of output terminals.

9. A method for recording and playback of an analog signal from an analog transducer with a recorder module, comprising the following steps:

placing a solid state analog storage device into a record mode;

producing a first timing pulse;

applying said first timing pulse to said solid state analog storage device;

applying said analog signal from said analog transducer to said solid state analog storage device;

storing said analog signal in said solid state analog storage device; and sequentially enabling a plurality of solid state analog storage devices.

10. The method of claim 9, further comprising the step of:

supplying electrical power to said analog transducer with a battery pack for production of said transducer signal, and supplying electrical power to said recorder module with said battery pack.

* * * * *